(12) United States Patent
Tan

(10) Patent No.: US 7,813,886 B2
(45) Date of Patent: Oct. 12, 2010

(54) CALIBRATION OF FREQUENCY MONITORS HAVING DUAL ETALON SIGNALS IN QUADRATURE

(75) Inventor: Sze Meng Tan, Sunnyvale, CA (US)

(73) Assignee: Picarro, Inc., Sunnyvale, CA (US)

( * ) Notice: Subject to any disclaimer, the term of this patent is extended or adjusted under 35 U.S.C. 154(b) by 409 days.

(21) Appl. No.: 11/999,375

(22) Filed: Dec. 4, 2007

(65) Prior Publication Data

US 2008/0137089 A1     Jun. 12, 2008

Related U.S. Application Data

(60) Provisional application No. 60/873,652, filed on Dec. 7, 2006.

(51) Int. Cl.
    *G06F 19/00*     (2006.01)
    *G01J 3/45*     (2006.01)

(52) U.S. Cl. .......................... 702/85; 356/454

(58) Field of Classification Search .................. 702/85, 702/95, 106; 356/352, 454
See application file for complete search history.

(56) References Cited

U.S. PATENT DOCUMENTS

| | | | |
|---|---|---|---|
| 6,178,002 B1 | 1/2001 | Mueller-Wirts | |
| 6,331,892 B1 | 12/2001 | Green | |
| 6,859,284 B2 | 2/2005 | Rella et al. | |
| 7,420,686 B2 * | 9/2008 | Tan | ............................ 356/454 |
| 2007/0024860 A1 * | 2/2007 | Tobiason et al. | ............ 356/498 |
| 2007/0195328 A1 | 8/2007 | Tan | |

* cited by examiner

*Primary Examiner*—Bryan Bui
(74) *Attorney, Agent, or Firm*—Lumen Patent Firm

(57) ABSTRACT

Improved calibration of a dual-etalon frequency monitor having x-y outputs is provided. An ellipse is fit to the (x,y) points from a set of calibration data. For each (x,y) point, an angle $\theta$ is determined. A linear fit of frequency to $\theta$ is provided. Differences between this linear fit and the determined values of $\theta$ are accounted for by including a spline fit to this difference in the calibration.

15 Claims, 3 Drawing Sheets

CALIBRATION OF FREQUENCY MONITORS HAVING DUAL ETALON SIGNALS IN QUADRATURE

CROSS REFERENCE TO RELATED APPLICATIONS

This application claims the benefit of U.S. provisional patent application No. 60/873,652, filed on Dec. 7, 2006, entitled "Laser wavelength targeting and auto-recalibration of a dual-etalon wavelength monitor", and hereby incorporated by reference in its entirety.

FIELD OF THE INVENTION

This invention relates to calibration of optical frequency or wavelength monitors.

BACKGROUND

Measurement of frequency (or wavelength) of an optical source is generally useful in a wide variety of situations, and is particularly important in applications where very precise control of laser output frequency is required, such as high precision spectroscopy. Accordingly, various methods for optical frequency monitoring have been developed to date. One such method is the use of one or more etalons to provide suitable signals for frequency monitoring. Etalons are attractive for frequency monitoring because they can provide high accuracy and precision without being unduly large or expensive.

One type of etalon frequency monitor relies on the use of two etalon signals in quadrature, because the use of two quadrature signals helps avoid reduced measurement sensitivity at local maxima or minima of the etalon signals. One example of this kind of approach is described in U.S. Pat. No. 6,859,284 and in U.S. Pat. No. 6,331,892, where detectors are disposed in an etalon interference pattern at a quadrature separation from each other. In U.S. Pat. No. 6,178,002, two beams take slightly different paths through an etalon, where the difference in path length is selected such that signals corresponding to the two beams are in quadrature.

The specific issue of how to derive a frequency reading from measured quadrature etalon signals has also been investigated. For example, in US 2007/0195328, "dead zones" of reduced sensitivity for each etalon signal are identified. If an etalon signal is in its dead zone, it is not included in the frequency computation. In this manner, the frequency computation is based on one or both of the etalon signals, and relatively useless etalon signals are systematically excluded from the computations, thereby improving performance.

However, the approach of defining dead zones in this manner can encounter significant difficulties in practice. In particular, switching from the use of one etalon signal to the use of two etalon signals at a dead zone boundary can lead to an undesirable situation where the frequency monitor error (i.e., the difference between monitor readout and actual frequency) is discontinuous. Although such discontinuities can be removed in calibration, they can reappear as a result of calibration drift. A discontinuous monitor error is particularly undesirable in situations where the monitor is part of a frequency control loop, since the loop may become unstable, or it may be impossible to access the target frequency at all.

Accordingly, it would be an advance in the art to derive frequency readings from a frequency monitor having two etalon signals in quadrature in a manner that provides high precision and accuracy and also inherently provides a continuous monitor error as a function of frequency.

SUMMARY

Improved calibration of a dual-etalon frequency monitor having x-y outputs is provided. An ellipse is fit to the (x,y) points from a set of calibration data. For each (x,y) point, an angle θ is determined. A linear fit of frequency to θ is provided. Differences between the calibration data and the linear fit are accommodated by including a spline fit to this difference in the calibration.

DETAILED DESCRIPTION

In order to better appreciate the present invention, it is helpful to consider how quadrature etalon signals have previously been employed to compute wavelength. In U.S. Pat. No. 6,331,892, it is assumed that the two etalon signals S1 and S2 are normalized to have equal amplitude and are proportional to $\sin(2\pi\lambda/\Lambda)$ and $\cos(2\pi\lambda/\Lambda)$, where $\lambda$ is wavelength and $\Lambda$ is the period of the etalon signals. Under these conditions, $\tan^{-1}(S1/S2)$ and $\cot^{-1}(S2/S1)$ are both proportional to wavelength, so with an appropriate linear scaling these quantities can provide the desired wavelength readout. A similar approach is considered in U.S. Pat. No. 6,178,002. As is well known in the art, etalon signals tend to be approximately periodic in both frequency and wavelength, so this kind of approach would also be applicable to measurement of frequency.

However, this relatively simple computational approach can lead to a significant loss of accuracy in the computed wavelength (or frequency) readout in practice. According to embodiments of the present invention, improved accuracy is provided by a calibration method including the following steps: a) providing calibration data; b) fitting an ellipse to the calibration data points; c) determining an angle parameter of each calibration data point from the fitted ellipse; d) determining a linear fit of frequency (or wavelength) to the angle parameter; e) determining the difference between the calibration data and the linear fit; f) fitting a spline to the difference; and g) providing the ellipse fit, the line fit and the spline fit as calibration outputs. These steps are explained in greater detail by way of the following example.

Figure 1:
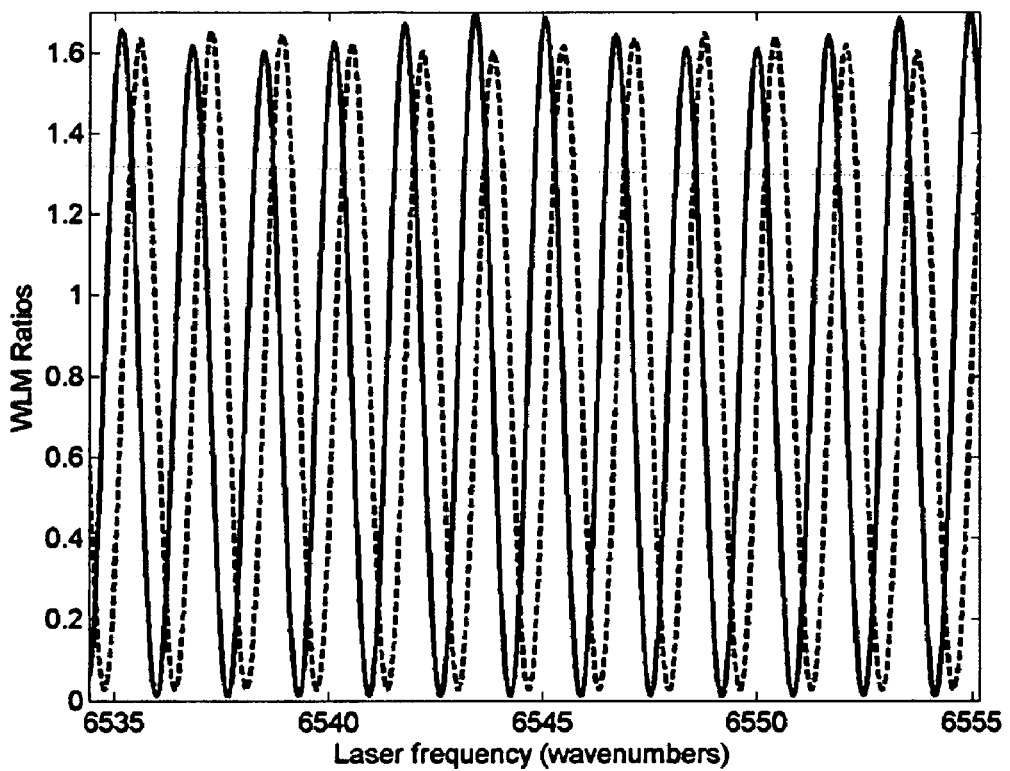
FIG. 1 shows an example of two measured etalon signals in quadrature from a frequency monitor.

FIG. 1 shows an example of measured frequency monitor data. Here laser frequency is measured by a wave meter, and the WLM ratio signals are outputs from a typical dual-etalon frequency monitor. It is convenient to regard these calibration data as being in the form of triples $(x_i, y_i, v_i)$ indexed by i. For each triple, $v_i$ is a known frequency, $x_i$ is a first etalon signal at $v_i$, and $y_i$ is a second etalon signal at $v_i$. The first and second etalon signals are substantially in quadrature (i.e., have a phase difference of about $\pi/2$, as shown in FIG. 1). Preferably, the etalon signals x and y are ratio signals that are substantially independent of the optical power received by the frequency monitor. Suitable arrangements of optical components for providing such etalon signals are well known in the art. For brevity it is convenient to regard any frequency monitor providing two etalon signals in quadrature as being a "dual-etalon frequency monitor", even if the monitor includes one etalon as opposed to two distinct physical etalons.

Figure 2:
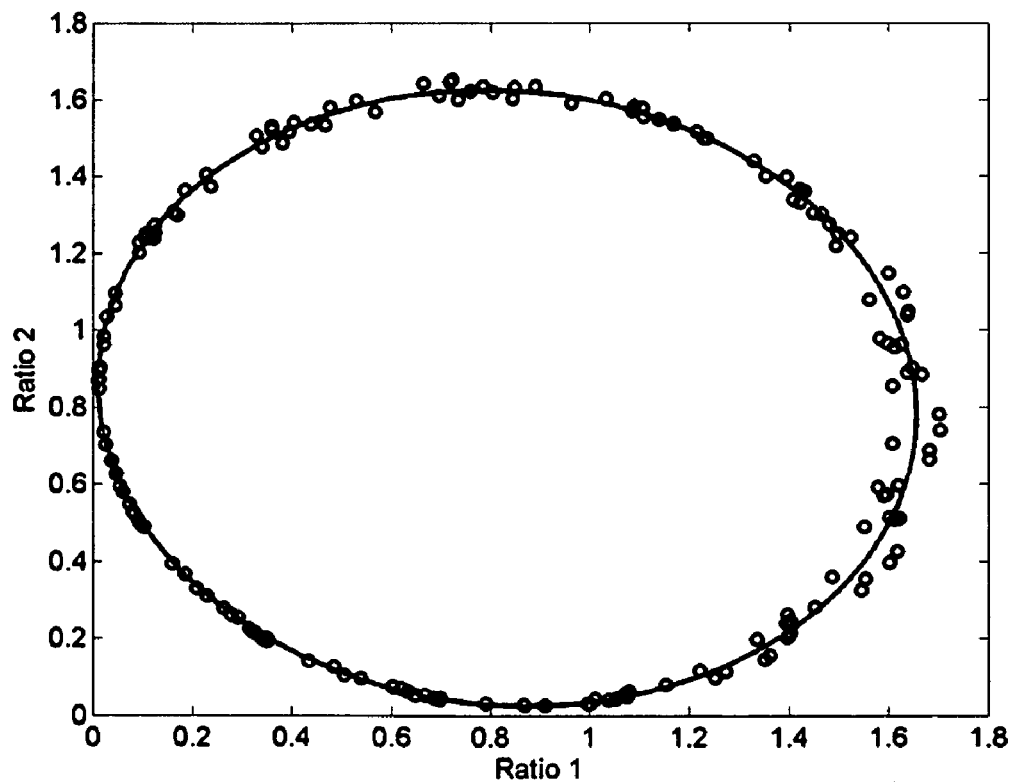
FIG. 2 shows an example of an elliptical fit to etalon signals as employed in an embodiment of the invention.

FIG. 2 shows a plot of the $(x_i, y_i)$ points in the x-y plane. In this example, the points tend to lie along an ellipse. For ideal etalon signals, the $(x_i, y_i)$ points should fall exactly on an ellipse. It is convenient to describe this ideal ellipse with the following equations:

$$x = x_0 + A \cos\theta, \text{ and} \qquad (1)$$

$$y = y_0 + B \sin(\theta + \epsilon). \qquad (2)$$

Here parameters $x_0$ and $y_0$ are the center of the ellipse, and parameters A and B account for the possibility of different amplitudes of x and y. The parameter $\epsilon$ accounts for the possibility of imperfect quadrature (i.e., x and y having a phase difference not exactly equal to an odd multiple of $\pi/2$). Ideally, the angle parameter $\theta$ is exactly proportional to frequency. Thus calibrating a dual-etalon frequency monitor can be regarded as determining the best linear relation between $\theta$ and $v$, as well as providing corrections to this linear relation. Note that $\theta$ is not the geometrical ellipse angle unless $\epsilon=0$. Allowing for unequal x and y amplitude and imperfect quadrature as in Eqs. 1 and 2 tends to provide substantially improved accuracy compared to the simpler approach of U.S. Pat. No. 6,331,892, which corresponds to assuming A=B and $\epsilon=0$ in Eqs. 1 and 2.

Although any method of fitting an ellipse to the $(x_i, y_i)$ points can be employed in practicing embodiments of the invention, it is preferred to begin by fitting the $(x_i, y_i)$ points to a quadratic form $$a_0 x^2 + a_1 xy + a_2 y^2 + a_3 x + a_4 y + a_5 = 0, \qquad (3)$$

to determine fitting parameters $a_0, a_1, a_2, a_3, a_4$, and $a_5$. Methods for performing such fitting are known, e.g., as described by Fitzgibbon et al. in "*Direct Least Squares Fitting of Ellipses*", IEEE Transactions on Pattern Analysis and Machine Intelligence, vol. 21, no. 5, pp. 476-480, May 1999. Once the parameters $a_0, a_1, a_2, a_3, a_4$, and $a_5$ are known, the parameters of interest (i.e., $x_0, y_0, A, B$, and $\epsilon$) can be determined as follows.

First, $x_0$ and $y_0$ are given by $$x_0 = \frac{a_1 a_4 - 2 a_2 a_3}{4 a_0 a_2 - a_1^2} \text{ and } y_0 = \frac{a_1 a_3 - 2 a_0 a_4}{4 a_0 a_2 - a_1^2}. \qquad (4)$$

Next, it is convenient to define $r_1$ and $r_2$ to be the lengths of the principal semi-axes, and $\phi$ as the angle which the first principal axis makes with respect to the x axis. These quantities are given by $$\tan 2\phi = \frac{a_1}{a_0 - a_2} \qquad (5)$$

$$r_1 = \sqrt{\frac{a_0 x_0^2 + a_1 x_0 y_0 + a_2 y_0^2 - a_5}{a_0 \cos^2\phi + a_1 \cos\phi \sin\phi + a_2 \sin^2\phi}}$$

$$r_2 = \sqrt{\frac{a_0 x_0^2 + a_1 x_0 y_0 + a_2 y_0^2 - a_5}{a_0 \sin^2\phi - a_1 \cos\phi \sin\phi + a_2 \cos^2\phi}}$$

Finally, we have $$A = \sqrt{r_1^2 \cos^2\phi + r_2^2 \sin^2\phi} \qquad (6)$$

$$B = \sqrt{r_1^2 \sin^2\phi + r_2^2 \cos^2\phi}$$

$$\cos\epsilon = \frac{r_1 r_2}{AB}$$

where the sign of E is negative if $(r_1 - r_2)\sin\phi \cos\phi < 0$. Following this procedure for the example of FIG. 2 gives $x_0 = 0.8316$, $y_0 = 0.8246$, $A = 0.8211$, $B = 0.8001$, and $\epsilon = -0.0513$. The resulting ellipse is shown with a solid line in FIG. 2.

Once the best fit ellipse is known, an angle parameter $\theta_i$ can be associated with each $(x_i, y_i)$ point. Since the $(x_i, y_i)$ points do not necessarily lie on the best fit ellipse, it is usually not possible to find a $\theta_i$ that satisfies Eqs. 1 and 2 simultaneously. There are various reasonable ways to calculate $\theta_i$ from $(x_i, y_i)$, any of which can be employed in practicing the invention. Preferably $\theta_i$ is determined from $$\theta_i = a\tan 2(A(y_i - y_0) - B(x_i - x_0)\sin\epsilon, B(x_i - x_0)\cos\epsilon), \qquad (7)$$

where $a\tan 2(y, x)$ is the arctangent of y/x with a range of $(-\pi, \pi]$ (i.e., a four quadrant angle). This procedure is equivalent to drawing a line from the center of the best fit ellipse to $(x_i, y_i)$ and computing $\theta_i$ using Eqs. 1 and 2 as applied to the intersection point of this radial line and the ellipse.

Figure 3:
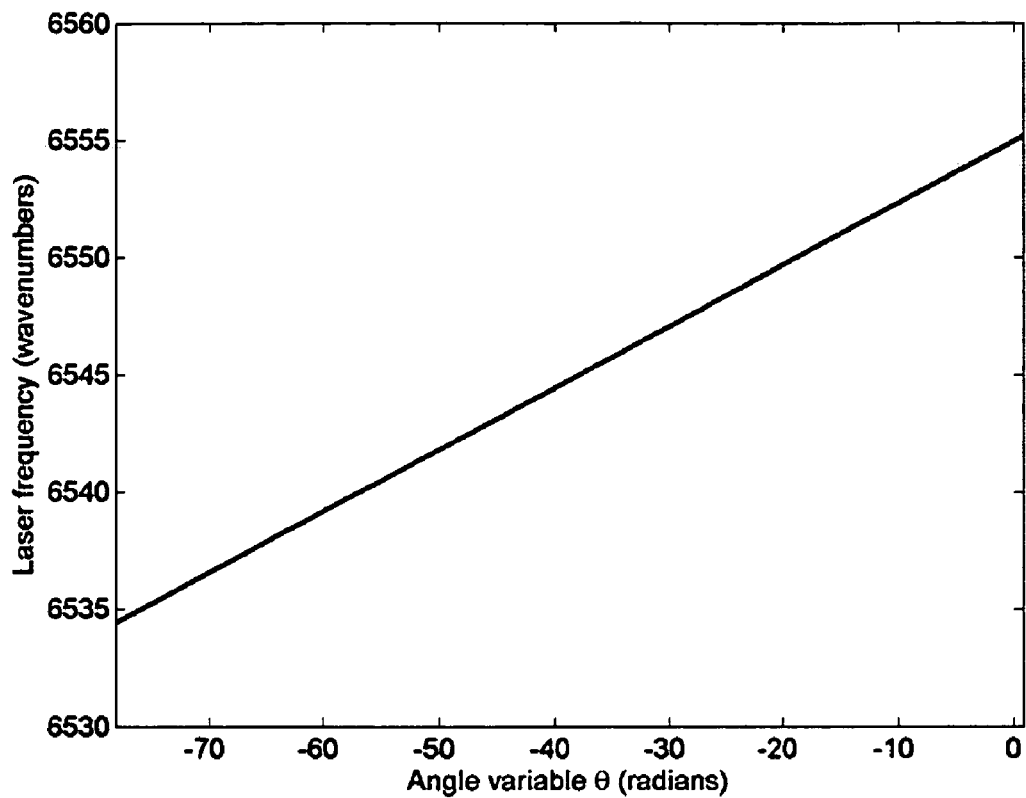
FIG. 3 shows an example of the relationship between frequency and angle variable and its proximity to a linear function as employed in an embodiment of the invention.

The result of Eq. 7 is an angle parameter in the range $(-\pi, \pi]$, but the frequency range of interest may cover a larger range of angles. In other words, there may be multiple revolutions along the ellipse, e.g., as shown in FIGS. 1 and 2. In such cases, it is convenient to add multiples of $2\pi$ as necessary to $\theta_i$ as determined by Eq. 7 in order to establish a continuous relation between frequency and angle, e.g., as shown in FIG. 3. Since the absolute frequencies $v_i$ of the calibration data are known, this is a straightforward process.

As seen in FIG. 3, the relation between frequency and angle is typically highly linear. Accordingly, fitting a line $v = s\theta + v_0$ to the set of points $(\theta_i, v_i)$ provides a linear angle-frequency fit, so the parameters s and $v_0$ can be regarded as first order calibration parameters. Any method of linear fitting (e.g., linear least squares) can be employed to determine this linear fit.

Figure 4:
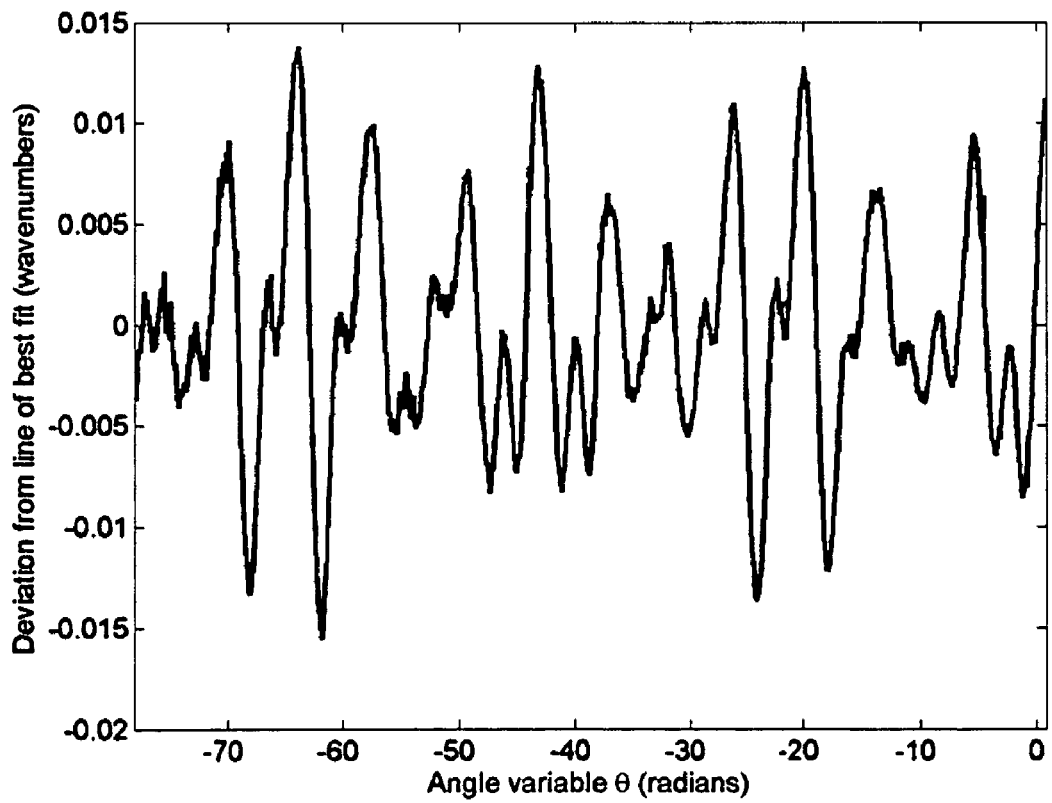
FIG. 4 shows the difference between the calibration data and the linear fit of the example of FIGS. 1-3.

However, for high precision applications, it can be important to account for differences between this linear fit and the calibration data. FIG. 4 shows a plot of this difference for the example of FIGS. 1-3. Here, the difference $e_i$ of the linear angle-frequency fit is defined by $e_i = v_i - (s\theta_i + v_0)$. The relative scale of the vertical axes of FIGS. 3 and 4 is noteworthy. The maximum difference magnitude in FIG. 4 is about 0.015 cm$^{-1}$, while the frequency in FIG. 3 is on the order of 6550 cm$^{-1}$. Thus the differences shown in FIG. 4 are on the order of 1 part in 400,000 or less. High precision calibration to further reduce this already low difference can be crucial for high precision spectroscopy applications (e.g., cavity ring-down spectroscopy for trace gas detection), but is not required for many other applications (e.g., wavelength division multiplexing for telecommunication).

Figure 5:
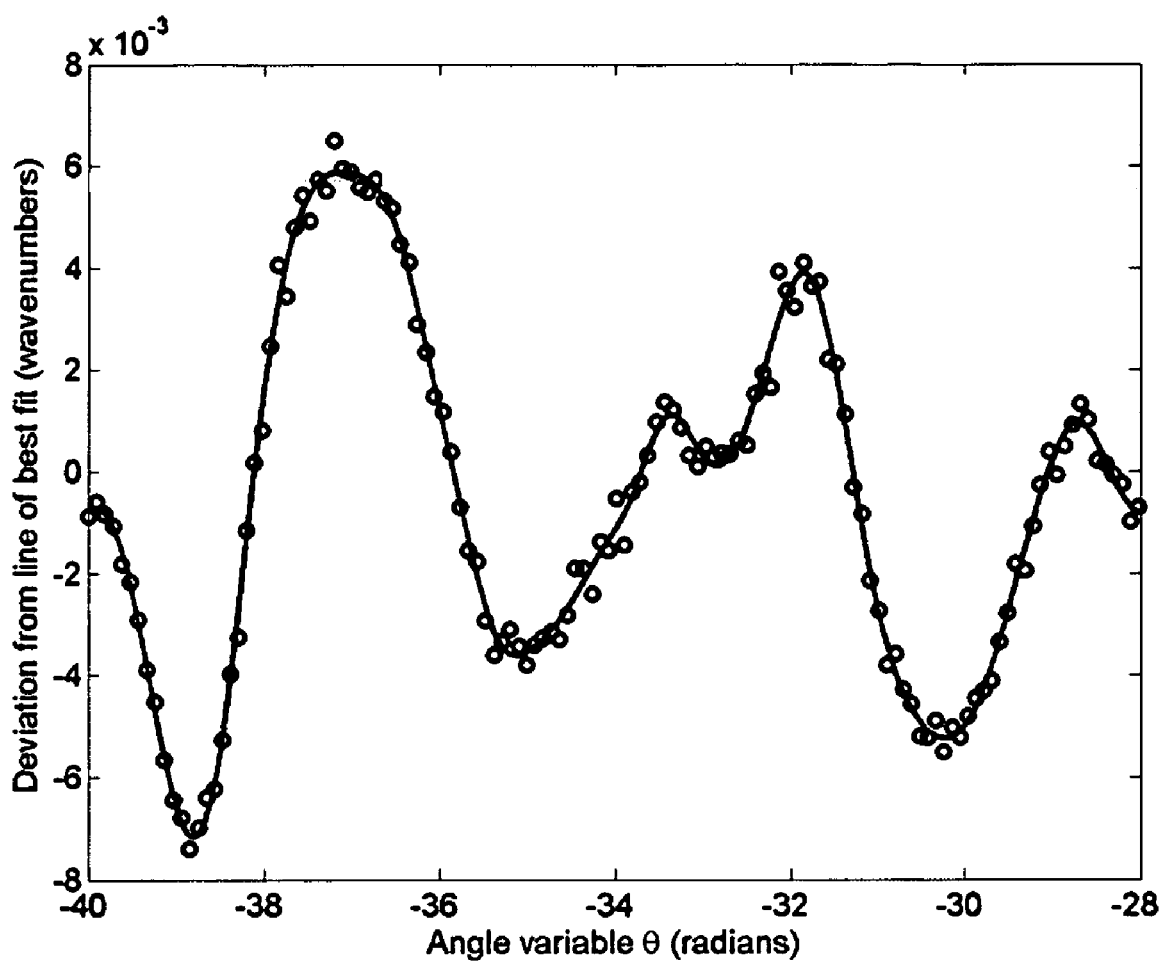
FIG. 5 shows a spline fit to the difference shown in FIG. 4 as employed in an embodiment of the invention, over a reduced angular range.

For calibration, it is helpful to use an appropriately smoothed fit to the differences $e_i$ as the correction to the first order linear model. Smoothing helps to reduce the effect of random measurement noise on the calibration. Preferably, this smoothed representation is obtained by fitting a spline to the set of points $(\theta_i, e_i)$ to provide a spline difference fit $e(\theta)$. More preferably, cubic B-splines having equally spaced knots are employed. For example, FIG. 5 shows the difference (circles) and corresponding B-spline fit (solid line) for part of the angular range of FIG. 4. In this example, the knots of the B-spline are spaced by $\pi/8$ radians. By fixing the knot spacing, the spline fit inherently performs a desirable smoothing function as compared to a spline constrained to pass through every point $e_i$. The amount of smoothing can be adjusted by altering the predetermined knot spacing, since increasing the knot spacing increases the smoothing effect, and decreasing the knot spacing decreases the smoothing effect. Methods for performing such spline fits are well known in the art.

At the end of this process, a set of $v(\theta)$ calibration outputs including the ellipse parameters A, B, $x_0$, $y_0$, and $\epsilon$, the line parameters s and $v_0$, and the spline fit $e(\theta)$ is available for further use. The calibration curve is given by $v=s\theta+v_0+e(\theta)$.

The preceding description relates to a calibration method. Further aspects of embodiments of the invention relate to using the $v(\theta)$ calibration outputs to measure the emission frequency of an optical source, to using the $v(\theta)$ calibration outputs to set the emission frequency of an optical source, and to updating the $v(\theta)$ calibration.

Once a $v(\theta)$ calibration is available, it can be employed to measure operating frequency of an optical source in a system including the calibrated dual-etalon frequency monitor. The measurement begins by measuring source operating data $(x_{op}, y_{op})$, where $x_{op}$ and $y_{op}$ are the etalon signals provided by the calibrated frequency monitor responsive to radiation from the optical source. An operating angle parameter $\theta_{op}$ can be calculated according to $$\theta_{op} = a\tan 2(A(y_{op}-y_0)-B(x_{op}-x_0)\sin\epsilon, B(x_{op}-x_0)\cos\epsilon). \tag{8}$$

Note that the ellipse parameters of the calibration are required in order to determine $\theta_{op}$ from $x_{op}$ and $y_{op}$. From $\theta_{op}$, the operating frequency $v_{op}$ can be determined according to $v_{op}=s\theta_{op}+v_0+e(\theta_{op})$, and provided as an output.

In cases where the frequency range of interest corresponds to an angular range greater than $2\pi$, it is necessary to remove the $2\pi n$ ambiguity. A relatively low precision frequency measurement will suffice to remove this ambiguity. More specifically, a set of angles $\theta_n=\theta_{op}+2\pi n$ can be defined, where n is any integer that results in $\theta_n$ being within the $\theta$ calibration range. A corresponding set of frequencies $v_n=v(\theta_n)$ can be calculated as described above. The frequency $v_n$ that is closest in value to the result of a secondary frequency measurement can be provided as the frequency output. Since the required precision for the secondary measurement is relatively low (i.e., it only needs to be able to distinguish $v_n$ from $v_{n\pm1}$), it is not particularly difficult to provide such a secondary measurement, and any such method can be employed in practicing the invention. Note that $e(\theta)$ has a domain which includes the entire calibration range of $\theta$, which can include many multiples of $2\pi$.

Frequently, an indirect secondary measurement can be sufficiently accurate. In one system design, the etalon free spectral range is 1.6 cm$^{-1}$ (i.e., about 48 GHz), and the optical source is a distributed feedback (DFB) laser having a temperature tuning coefficient of 14 GHz/C. Successive revolutions of the ellipse are separated by about 3.4° C., so knowledge of the DFB temperature with about 1° C. precision or better can provide a sufficiently accurate secondary frequency measurement.

The $v(\theta)$ calibration as described above can also be employed for setting the operating frequency of an optical source to a desired value $v_{in}$ in a system having a calibrated dual-etalon frequency monitor. The first step here is to determine an angle $\theta_{in}$ corresponding to $v_{in}$ according to $v_{in}=s\theta_{in}+v_0+e(\theta_{in})$. Various methods can be employed for this calculation. One approach is inverse cubic interpolation to solve for $\theta_{in}$, which is appropriate because $e(\theta_{in})$ is a third-degree function of $\theta_{in}$. Another approach is iterative numerical solution of $v_{in}=s\theta_{in}+v_0+e(\theta_{in})$, using $\theta^*=(v_{in}-v_0)/s$ as a starting point. In cases where the frequency range of interest corresponds to an angular range greater than $2\pi$, coarse frequency control of the optical source sufficient to distinguish $v_{in}$ from any frequency $v_n=v(\theta_{in}+2\pi n)$, where n is any non-zero integer, can be provided. Such frequency control is typically not difficult, and any such method can be employed in practicing the invention.

For fine frequency control, it is necessary to control the optical source such that the etalon signals x and y correspond to the angle $\theta_{in}$. It is important to note that such control should not attempt to enforce Eqs. 1 and 2 simultaneously, since it is ordinarily not possible to satisfy both these equations simultaneously. Recall in FIG. 2 that most of the data points are not on the calibration ellipse defined by Eqs. 1 and 2. Instead a control condition of the form $$w_1(x-x_0)+w_2(y-y_0)=0 \tag{9}$$

can be enforced, where the weights $w_1$ and $w_2$ are preferably each in the range (-1, 1]. A preferred choice for these weights is given by $$w_1 = -K\frac{\sin(\theta_{in}+\epsilon)}{A\cos\epsilon} \tag{10}$$

$$w_2 = K\frac{\cos\theta_{in}}{B\cos\epsilon}$$

where K is an overall scale factor that can be employed to appropriately scale $w_1$ and $w_2$. This choice is preferred because it causes the derivative of the left hand side of Eq. 9 with respect to $\theta_{in}$ at the desired set point to be equal to $-K$, which is independent of $\theta_{in}$ and all the parameters of the wavelength monitor, which is highly desirable for the control loop. Since the ratio of $w_1$ to $w_2$ is the important quantity for setting $\theta$, the scaling can be selected for convenience of control loop implementation. For a reasonable amount of calibration drift (i.e., a drift which is not so large as to cause the nominal ellipse center $(x_0, y_0)$ to lie outside the actual path defined by the $(x_i, y_i)$ points), the locking condition of Eq. 9 can be satisfied.

In general, any set of known frequencies having corresponding measured etalon signals can be employed to generate an initial calibration and/or to update an existing calibration. Calibration update can be full or partial. A full calibration update would include re-calculation of the ellipse parameters based on the new calibration data, while a partial calibration update would make use of the existing ellipse parameters and update the linear fit and/or the spline fit.

In many cases, it is preferred to perform partial calibration updates incrementally, e.g., by making incremental changes to the coefficients of the spline fit $e(\theta)$. Since calibration updates typically result in small changes to the spline fit coefficients, computation time can be significantly reduced by using the existing spline coefficients as a starting point in an iterative update calculation. Methods for such iterative updating of a spline fit are well known in the art, and any such method can be employed in practicing the invention.

An output frequency error $\Delta v_j = v_{j,out} - v_j$ can be measured at several points, where $v_j$ is the frequency according to the calibrated system (i.e., related to $\theta$ according to the $v(\theta)$ calibration), and $v_{j,out}$ is the corresponding measurement of the source frequency (e.g., as provided by an independent instrument, such as a wave meter). The spline difference fit $e(\theta)$ can be revised to decrease the output frequency error (e.g., by reducing the squared error). Preferably, such revision is performed according to an iterative procedure to minimize the output frequency error.

In some applications of high precision frequency monitoring, there are special features of the overall system that can be exploited to expedite calibration. For example, in a cavity ring-down spectroscopy (CRDS) instrument, the ring-down cavity can serve as a calibration frequency measurement standard because the resonant frequencies of the cavity are equally spaced by the free spectral range (FSR) of the cavity. There are several ways this feature can be exploited for calibration.

For example, the frequencies for initial calibration or calibration update of the frequency monitor can be selected to be equally spaced by the ring-down cavity FSR. This possibility is particularly convenient for calibration update, because it is possible to perform ring-down measurements in such a way that helpful data for calibration update are automatically generated. In a typical CRDS instrument, the length of the ring-down cavity can be varied over a short distance (i.e., on the order of an optical wavelength) by a suitable mechanical actuator, such as a piezoelectric transducer (PZT). The PZT is typically scanned repetitively through a fixed range of motion in order to generate ring-down events when a mode of the ring-down cavity coincides in frequency with the source frequency.

It is possible to adjust the nominal frequencies of a source operating frequency scan such that the PZT voltages are equal for all ring-down events. For example, the nominal separation between frequencies of the scan can be adjusted to remove any systematic dependence of PZT voltage on frequency, and then the scan frequencies can be individually adjusted as needed to equalize the PZT voltages as much as possible.

When this condition of equal PZT voltages holds, the frequency spacing for the source tuning is equal to the ring-down cavity FSR, because the cavity length is the same at all ring-down events. In this situation, the calibration can be updated because the actual frequencies of the ring-down events are known to be exactly equally separated in frequency. A further advantage of this arrangement is that the resulting calibration update does not depend at all on the PZT sensitivity (i.e., the µm/V provided by the PZT), since all data are obtained at the same PZT voltage.

Such information can be employed to perform a relative calibration update or an absolute calibration update. An absolute calibration update can be performed if the cavity FSR is known and if the frequency of one of the calibration update points is independently known (e.g., by reference to a spectral line). Such absolute calibration updating can proceed as described above.

For a relative calibration update, it is preferred to impose a constraint of no average frequency shift in the update. More specifically, suppose an equal PZT voltage FSR measurement scheme as described above provides a set of $(x_i, y_i, \theta_i, v_i)$ points, where $x_i$ and $y_i$ are the etalon signals, $\theta_i$ is the angle corresponding to $x_i$ and $y_i$, and $v_i$ is the nominal frequency calculated using $\theta_i$ according to the existing $v(\theta)$ calibration data. Calibration drift can lead to a situation in which the $v_i$ are not equally spaced. The $v(\theta)$ calibration data can be updated such that a set of nominal frequencies $v_i'$ corresponding to $\theta_i$ as calculated from the updated calibration data are equally spaced. As indicated above, it is preferred to constrain the updating method such that the average of the $v_i'$ is equal to the average of the $v_i$. Methods for updating a spline fit subject to such a constraint are known in the art. The cavity FSR can be provided as an input to the updating method, but this is not essential, because the frequency spacing can also be regarded as a parameter of the updating fit.

The preceding description of relative calibration updates is based on setting the frequency spacing equal to the cavity FSR. In some cases where data points having different PZT voltages are employed, sufficient accuracy for calibration updating can be provided by including an estimate of the PZT sensitivity in the calculations.

The preceding description has been by way of example as opposed to limitation. In particular, the same ideas are applicable to calibration of a wavelength monitor, setting the operating wavelength of an optical source, updating wavelength monitor calibration, and measuring wavelength with a calibrated dual-etalon wavelength monitor. The basis for this equivalence is the approximate periodicity of etalon signals with respect to both frequency and wavelength. The signal from a non-dispersive etalon is periodic in frequency, so it can only be approximately periodic in wavelength because wavelength is inversely proportional to frequency. However, in many wavelength monitor applications, this lack of exact periodicity is not troublesome.

The invention claimed is:

1. A method of calibrating a frequency monitor having dual etalon signals in quadrature, the method comprising:

a) providing calibration data in the form of triples $(x_i, y_i, v_i)$ indexed by i, wherein for each triple, $x_i$ is a first etalon signal at a known frequency $v_i$ and $y_i$ is a second etalon signal at said known frequency $v_i$, and wherein said first and second etalon signals are substantially in quadrature;

b) fitting an ellipse to the set of points $(x_i, y_i)$, wherein said ellipse is parametrically defined according to $$x = x_0 + A \cos \theta$$

$$y = y_0 + B \sin(\theta + \epsilon);$$

c) calculating an angle parameter $\theta_i$ of said ellipse for each of said points $(x_i, y_i)$;

d) fitting a line to the set of points $(\theta_i, v_i)$ to provide a linear angle-frequency fit, wherein said line is parametrically defined according to $v = s\theta + v_0$;

e) providing said parameters s and $v_0$ and said parameters A, B, $x_0$, $y_0$, and $\epsilon$ as $v(\theta)$ calibration outputs;

f) calibrating said frequency monitor having dual etalon signals in quadrature using said $v(\theta)$ calibration outputs.

2. The method of claim 1, further comprising:

g) determining a difference $e_i$ of said linear angle-frequency fit at each of said triples according to $e_i = v_i - (s\theta_i + v_0)$;

h) fitting a spline to the set of points $(\theta_i, e_i)$ to provide a spline difference fit $e(\theta)$;

i) providing said spline difference fit $e(\theta)$ as part of said $v(\theta)$ calibration outputs.

3. The method of claim 1, wherein said calculating an angle parameter $\theta_i$ of said ellipse for each of said points $(x_i, y_i)$ comprises setting $\theta_i=$ a tan $2(A(y_i-y_0)-B(x_i-x_0)\sin \epsilon, B(x_i-x_0)\cos \epsilon)$.

4. The method of claim 1, wherein said frequencies $\nu_i$ of said calibration data are equally spaced.

5. The method of claim 4, wherein said frequencies $\nu_i$ of said calibration data are determined by a reference optical cavity.

6. The method of claim 1, wherein said fitting an ellipse comprises:
fitting a quadratic form $a_0x^2+a_1xy+a_2y^2+a_3x+a_4y+a_5=0$ to said set of points $(x_i, y_i)$ to provide values for fitting parameters $a_0, a_1, a_2, a_3, a_4,$ and $a_5$;
calculating values for $x_0, y_0, A, B,$ and $\epsilon$, from said fitting parameters $a_0, a_1, a_2, a_3, a_4,$ and $a_5$.

7. The method of claim 2, wherein said fitting a spline comprises fitting cubic B-splines defined on a uniformly spaced set of knots.

8. A method of measuring an operating frequency of an optical source in a system including a frequency monitor having dual etalon signals in quadrature, the method comprising:
calibrating said frequency monitor according to the method of claim 1;
measuring source operating data $(x_{op}, y_{op})$, wherein $x_{op}$ and $y_{op}$ are respectively said first and second etalon signals provided by said frequency monitor responsive to radiation from said optical source having said operating frequency;
calculating an angle parameter $\theta_{op}$ of said optical source according to a $\theta_{op}=$a tan $2(A(y_{op}-y_0)-B(x_{op}-x_0)\sin \epsilon, B(x_{op}-x_0)\cos \epsilon)$;
determining said operating frequency from said $\nu(\theta)$ calibration outputs and from said angle parameter $\theta_{op}$;
providing said determined operating frequency as an output.

9. The method of claim 8, wherein said determining said operating frequency from said $\nu(\theta)$ calibration outputs and from said angle parameter $\theta_{op}$ comprises:
providing a secondary measurement of said operating frequency;
defining a set of angles $\theta_n=\theta_{op}+2\pi n$, where n is any integer that results in $\theta_n$ being within a predetermined calibration range;
calculating a set of frequencies $\nu_n=\theta(\theta_n)$ from said $\nu(\theta)$ calibration outputs and from said set of angles $\theta_n$;
selecting one of said set of frequencies $\nu_n$ as said determined operating frequency according to said secondary measurement.

10. A method of setting an optical source to operate at or near a predetermined frequency in a system including a frequency monitor having dual etalon signals in quadrature, the method comprising:
calibrating said frequency monitor according to the method of claim 2;
determining an angle $\theta_{in}$ corresponding to said predetermined frequency $\nu_{in}$ from said $\nu(\theta)$ calibration outputs;
controlling the output frequency of said optical source such that $w_1(x-x_0)+w_2(y-y_0)=0$, wherein x and y are said first and second etalon signals respectively, and wherein $$w_1 = -\frac{\sin(\theta_{in}+\varepsilon)}{A\cos\varepsilon} \text{ and } w_2 = \frac{\cos\theta_{in}}{B\cos\varepsilon}.$$

11. The method of claim 10, further comprising:
providing coarse frequency control of said optical source sufficient to distinguish said predetermined frequency $\nu_{in}$ from any frequency $\nu_n=\nu(\theta_{in}+2\pi n)$, where n can be any non-zero integer;
wherein said frequencies $\nu_n$ are determined from said corresponding angles $\theta_{in}+2\pi n$ according to said $\nu(\theta)$ calibration outputs.

12. A method of calibration update in a system having a frequency monitor having dual etalon signals in quadrature, the method comprising:
setting an optical source to operate at or near each of a set of predetermined frequencies $\nu_j$ according to the method of claim 10;
measuring an output frequency error $\Delta\nu_j=\nu_{j,out}-\nu_j$ at each of said set of predetermined frequencies, where $\nu_{j,out}$ is optical source frequency when said source is set to operate at $\nu_j$, wherein $\nu_{j,out}$ is measured independently of said $\nu(\theta)$ calibration outputs;
revising said spline difference fit $e(\theta)$ to decrease said output frequency error, by making incremental changes to spline fit coefficients.

13. The method of claim 12, wherein said revising said spline difference fit is repeated one or more times.

14. A method of calibrating a wavelength monitor having dual etalon signals in quadrature, the method comprising:
a) providing calibration data in the form of triples $(x_i, y_i, \lambda_i)$ indexed by i, wherein for each triple, $x_i$ is a first etalon signal at a known wavelength $\lambda_i$ and $y_i$ is a second etalon signal at said known wavelength $\lambda_i$, and wherein said first and second etalon signals are substantially in quadrature;
b) fitting an ellipse to the set of points $(x_i, y_i)$, wherein said ellipse is parametrically defined according to $x=x_0+A \cos \theta$ $y=y_0+B \sin(\theta+\epsilon)$;

c) calculating an angle parameter $\theta_i$ of said ellipse for each of said points $(x_i, y_i)$;
d) fitting a line to the set of points $(\theta_i, \lambda_i)$ to provide a linear angle-wavelength fit, wherein said line is parametrically defined according to $\lambda=s\theta+\lambda_0$;
e) providing said parameters s and $\lambda_0$ and said parameters A, B, $x_0$, $y_0$, and $\epsilon$ as $\lambda(\theta)$ calibration outputs;
f) calibrating said wavelength monitor having dual etalon signals in quadrature using said $\lambda(\theta)$ calibration outputs.

15. The method of claim 14, further comprising:
g) determining a difference $e_i$ of said linear angle-wavelength fit at each of said triples according to $e_i=\lambda_i-(s\theta_i+\lambda_0)$;
h) fitting a spline to the set of points $(\theta_i, e_i)$ to provide a spline difference fit $e(\theta)$;
i) providing said spline difference fit $e(\theta)$ as part of said $\lambda(\theta)$ calibration outputs.

* * * * *